United States Patent [19]
Lidorenko et al.

[11] 4,418,238
[45] Nov. 29, 1983

[54] PHOTOELECTRIC SOLAR CELL ARRAY

[76] Inventors: Nikolai S. Lidorenko, ulitsa Kibalchicha, 2, kv. 217, Moscow; Viktor V. Afian, ulitsa Sevaka, 2, kv. 13, Erevan; Albert V. Vartanian, Aigestan, 10 ulitsa, 2, kv. 57, Erevan; Ruben G. Martirosian, ulitsa Shinararneri, 27, kv. 32, Erevan; Stanislav V. Ryabikov, pereulok Vasnetsova, 12, kv. 64; Dmitry S. Strebkov, Kirovogradsky proezd, 3, korpus 1, kv. 17, both of Moscow, all of U.S.S.R.

[21] Appl. No.: 313,339

[22] Filed: Oct. 20, 1981

[51] Int. Cl.³ .............................................. H01L 31/04
[52] U.S. Cl. .................................................... 136/246
[58] Field of Search ........................................ 136/246

[56] References Cited

U.S. PATENT DOCUMENTS

| | | | |
|---|---|---|---|
| 4,021,267 | 5/1977 | Dettling | 136/246 |
| 4,146,407 | 3/1979 | Litsenko et al. | 136/246 |
| 4,367,366 | 1/1983 | Bloss et al. | 136/246 |

FOREIGN PATENT DOCUMENTS

| | | | |
|---|---|---|---|
| 34211 | 1/1982 | European Pat. Off. | 136/246 |
| 2629641 | 1/1978 | Fed. Rep. of Germany | 126/417 |
| 2749992 | 5/1979 | Fed. Rep. of Germany | 136/259 |
| 3005914 | 9/1981 | Fed. Rep. of Germany | 136/246 |
| 2342558 | 9/1977 | France | 136/246 |

OTHER PUBLICATIONS

Radio Shack 1974–1975, Dictionary of Electronics, pp. 422 and 425.
W. H. Bloss et al., "Advanced Concepts for Photovoltaic Concentration", Proceedings, 3rd European Community Photovoltaic Solar Energy Conferenc e, (Oct. 1980), Reidel Publishing Co. (1981), pp. 401–407.
"Solar Energy Conversion with Fluorescent Collectors" by Goetzberger, et al., APPLIED PHYSICS, vol. 14, 1977.

*Primary Examiner*—Aaron Weisstuch
*Attorney, Agent, or Firm*—Lilling & Greenspan

[57] ABSTRACT

A photoelectric solar cell device comprises a dispersing element exposed to the sun's radiation and followed in the optical path by photocells having different spectral sensitivities. Each photocell has its working surface so oriented that the light beam with the wavelength corresponding to the maximum spectral sensitivity of that photocell impinges on its working surface. The dispersing element is a hologram representing light sources with different wavelengths. The photocells are positioned in the image planes of the light sources producing the light beams of the corresponding wavelengths.

1 Claim, 3 Drawing Figures

PHOTOELECTRIC SOLAR CELL ARRAY

FIELD OF THE INVENTION

The invention relates to devices that convert the sun's radiation to electrical energy, and more particularly to photoelectric solar cells.

DESCRIPTION OF THE PRIOR ART

Known in the art is a photoelectric solar cell device which comprises photocells each having two working surfaces, said photocells being positioned in a manner such that they occupy half the input aperture of a concave reflector, which may be implemented, for example, in the form of a dihedral angle (cf. French Pat. No. 2,342,558, 1977). The incident radiation is divided into two light beams. A first light beam impinges on the front working surface of a given photocell. A second light beam impinges, upon reflection, on the rear working surface of the photocell.

The photocell of the described patent has a low photo efficiency since its working surfaces are exposed only once to a nonconcentrated sunlight. Moreover, the sun's radiation incident on both working surfaces has the same spectral composition. As a result, a photocell having two working surfaces with different spectral sensitivities cannot be used effectively in this device.

There is another known photoelectric solar cell device comprising two sunlight concentration elements and a photocell with two working surfaces installed between said elements and accommodated in a glass envelope. The latter is implemented as a lens which is filled with a transparent liquid (cf., U.S. Pat. No. 4,146,407 filed 1979). This device has large dimensions and mass. Moreover, there occurs therein considerable radiation losses due to the fact that the sun's radiation passes many times through the optical surfaces of the concentration elements. Finally, sunlight incident upon the two working surfaces of the photocell is of the same spectral composition, a feature with which few practical applications of the device are possible.

There is known still another photoelectric solar cell device comprising a dispersing element in the form of a prism which is exposed to the sun's radiation and disperses it into component colors; that prism is followed by a number of photocells having different spectral sensitivities (cf. the U.S. Pat. No. 4,021,267, filed 1977).

Each photocell has its working surface facing that light beam whose wavelength corresponds to the maximum spectral sensitivity of the photocell.

In the described device, the dispersing element is adapted to disperse the incident radiation into component colors in a manner such that the dispersed radiation is not subject to concentration. Concentration is increased by means of a dispersed radiation concentrator which makes the module inconveniently complicated.

There is known yet another photoelectric solar cell device comprising a dispersing element that includes a number of solar radiation concentration elements implemented as plane-parallel plates with fluorescence centers, said plates being followed by a number of photocells having different spectral sensitivities (cf. Federal Republic of Germany Pat. No. 2,629,641 (1976). The fluorescence centers tend to absorb a certain spectral region of the sun's radiation and re-emit radiation belonging to a spectral region of longer wavelengths. Owing to the effect of total internal reflection, the fluorescence radiation is propagated within the plate towards its end faces. One, exit end face of each plate is void of a reflecting coating and the concentrated radiation thus exits from that end face, while the remaining end faces of the plate are provided with reflecting coatings. Each photocell has its working surface facing the exit end face of that plate which emits a concentrated light beam with a wavelength corresponding to a maximum sensitivity of that photocell.

In the described device, there are large energy losses resulting, in particular, from the loss of fluorescence radiation which is incident upon the "plate-air" interface at an angle which is less than the critical angle. Moreover, each photocell requires its own sunlight concentration element, which results in a sophisticated construction of the cell.

SUMMARY OF THE INVENTION

It is an object of the present invention to provide a photoelectric solar cell device of high photo efficiency.

It is another object of the invention to provide a photoelectric solar cell device of simpler construction.

These and other objects of the invention are attained by a light dispersing element exposed to the sun's radiation and followed by an array of photocells, each having a specific spectral sensitivity and also having its working surface so oriented that the light beam with the wavelength corresponding to a maximum spectral sensitivity of that photocell impinges on said working surface. According to the invention, the dispersing element is implemented in the form of a hologram representing light sources with different wavelengths equal in number to the spectral regions employed. The photocells are each positioned in the image planes of the light sources producing the light beams of the corresponding wavelengths.

Advantageously, in the photoelectric solar cell array each photocell should have two working surfaces with different spectral sensitivities and said hologram should have two parts. A one of said parts of said hologram is adapted to face one of the working surfaces and is a transmission hologram representing light sources which have their wavelengths corresponding to the maxima of the spectral sensitivities of said working surfaces. A second one of said two parts of said hologram is adapted to face the other of said working surfaces and is a reflection hologram representing light sources which have their wavelengths corresponding to the maxima of the spectral sensitivities of said second working surfaces. This provides for higher efficiency of utilization of the photocell active material.

The photoelectric solar cell of the invention operates to disperse the incident sun's radiation and concentrate the different spectral regions thereof so produced on the photocells having different spectral sensitivities. Each of said photocells has its working surface so oriented that the light beam with the wavelength corresponding to the maximum spectral sensitivity of that photocell impinges on said working surface, thereby providing for an effective conversion of the sun's energy into electricity. As a result, a savings of expensive semiconductor material is achieved and the cost per unit of the produced electric energy is decreased. The use of the lightsource hologram provides for simpler construction and smaller mass and dimensions thereof, and also for a simpler method of fabrication of the cell.

BRIEF DESCRIPTION OF THE DRAWINGS

The invention will now be described in more detail, by way of example, with reference to the accompanying drawings, in which.

DETAILED DESCRIPTION OF THE INVENTION

Figure 1:
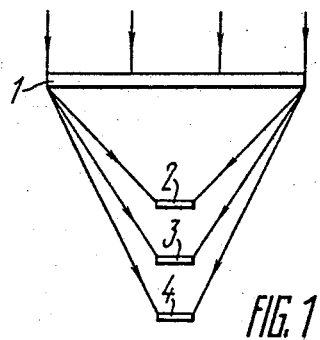
FIG. 1 is a diagrammatic representation of a photoelectric solar cell device with a number of photocells arranged in series with one another along the path of the sun's radiation, according to the invention.

Referring to FIG. 1, the photoelectric solar cell array of the invention comprises a dispersing element which is a hologram 1 representing light sources with different wavelengths, the hologram 1 being followed by photocells 2, 3 and 4 having different spectral sensitivities and arranged in the path of the sun's radiation. There may be the following types of holograms 1: reflection, transmission, two-dimensional, and three-dimensional. The diffraction grating of the hologram 1 contains data on the wavelength, shape and location of light sources with respect to the hologram surface; the data being characteristic of these light sources at the time during which the structure of the diffraction grating is formed.

The hologram 1 contains data on the light sources arranged in series with one another at different distances from it. The photocells 2, 3 and 4 are each positioned in the image planes of the light sources whose wavelengths correspond to the maximum sensitivities of the respective photocells. This means that in the given embodiment the photocells 2, 3 and 4 follow one after another along the path of the radiation.

Figure 2:
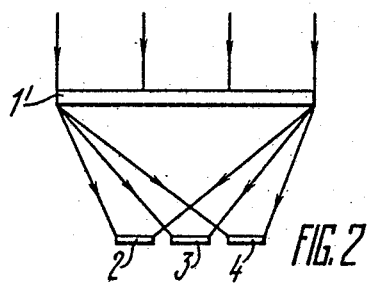
FIG. 2 is an embodiment of a photoelectric solar cell device having its array of photocells arranged in one plane, according to the invention.

Unlike the hologram 1 of FIG. 1, hologram 1' (FIG. 2) contains data on light sources which are arranged in one plane, in spaced relation to one another. The photocells 2, 3 and 4 of this embodiment are positioned in a single image plane of these light sources.

Figure 3:
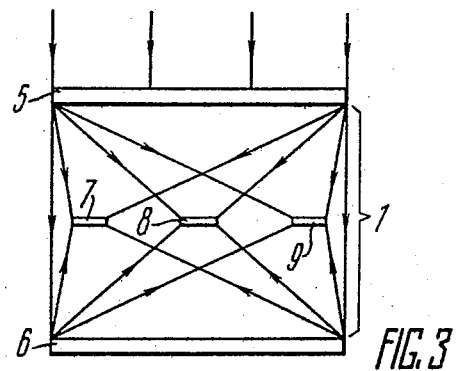
FIG. 3 is a diagrammatic representation of a photoelectric solar cell device with each photocell having two working surfaces, according to the invention.

The photoelectric solar cell device of FIG. 3 has its hologram 1 comprising two parts, as follows: one is a transmission hologram 5 and one is a reflection hologram 6. The photocells 7, 8 and 9 each have two working surfaces with different spectral sensitivities. The transmission hologram 5 produces images of the light sources with different wavelengths (focal spots) which are aligned in pairs with the corresponding images of the light sources with different wavelengths which are produced by the reflection hologram 6. The photocells 7, 8 and 9 are positioned in the alignment plane accommodating the focal spots produced by the holograms 5 and 6 and have their working surfaces facing the the concentrated light beams whose wavelengths correspond to the maximum sensitivities of these working surfaces. Physically, the hologram 1 (1') may be implemented as a layer of material laid down on a rigid transparent plate with an arbitrary surface geometry.

The light-source hologram 1 is a complex diffraction grating. When passing through it, the component colors of the sun's radiation interact therewith and are deflected so that they produce images of light sources of different wavelengths. The parameters of the diffraction grating are selected during the manufacture of the hologram by recording interference patterns with the aid of two monochromatic beams, which patterns are equal in number to the spectral regions employed. The wavelengths of the monochromatic beams correspond to the maxima of the spectral sensitivities of the working surfaces of the photodetectors.

The device of the invention operates in the following manner. In the case of the embodiment of FIG. 2, the hologram 1 may be a two-dimensional one obtained from a single light source. When such a hologram is exposed to the sun's radiation, the latter is dispersed due to the diffraction effect into component colors and is subject simultaneously to concentration. As a result, there appear in a given succession focal spots in the spectral region from the infrared to the untraviolet, when receding from the hologram plane, and the photocells 2, 3 and 4 in the respective focal planes receive the concentrated radiations.

A three-dimensional hologram of transmission of reflection type diffracts only that portion of the sunlight spectrum which follows the Bragg law for the chosen parameters of the diffraction grating. In the cell of FIG. 3, a three-dimensional transmission hologram 5 produces three different concentrated regions of the sunlight spectrum received by the upper working surfaces of the photocells 7, 8 and 9. The remaining part of the spectrum is sent through the hologram 5 undisturbed and impinges on the reflection hologram. 6. Using this part of the spectrum, the hologram 6 produces another three concentrated regions received by the lower working surfaces of the photocells 7, 8 and 9. Thus the different regions of the sunlight spectrum impinge in concentrated condition on their respective working surfaces of the photocells 7, 8 and 9 having different spectral sensitivities. Under these circumstances, the parameters of the concentration elements and the receivers of the sun's radiation are used on an optimum basis.

What is claimed is:

1. A photoelectric solar cell comprising:
 a light dispersing element adapted to be exposed to the sun's radiation and implemented as a hologram, having first and second parts, representing light sources with different wavelengths;
 a plurality of photocells, each having different spectral sensitivities and first and second working surfaces with different spectral sensitivites and arranged behind the dispersing element along the path of the sun's radiation, said working surfaces being exposed to the light beams with the wavelengths corresponding to the maximum spectral sensitivities of said photocells, said photocells each being positioned in the image planes of the light sources producing the light beams of the corresponding wavelengths;
 wherein said first part of said hologram faces first working surfaces of said photocells and is implemented as a transmission hologram representing light sources which have wavelengths corresponding to the maxima of the spectral sensitivities of said first working surfaces; and said second part of said hologram faces said second working surfaces of said photocells and is implemented as a reflection hologram representing light sources which have wave lengths corresponding to the maxima of the spectral sensitivities of said second working surfaces.

* * * * *

UNITED STATES PATENT AND TRADEMARK OFFICE
CERTIFICATE OF CORRECTION

PATENT NO. : 4,418,238
DATED : November 29, 1983
INVENTOR(S) : Nikolai S. LIDORENKO, et al It is certified that error appears in the above-identified patent and that said Letters Patent is hereby corrected as shown below:

Claim 1, line 2 (column 4, line 41), delete "adapted to be".

Signed and Sealed this

Tenth Day of April 1984

[SEAL]

Attest:

GERALD J. MOSSINGHOFF

Attesting Officer    Commissioner of Patents and Trademarks